US012588432B2

(12) United States Patent
Pandey et al.

(10) Patent No.: US 12,588,432 B2
(45) Date of Patent: Mar. 24, 2026

(54) METHODS FOR TRANSFERRING GRAPHENE TO SUBSTRATES AND RELATED LITHOGRAPHIC STACKS AND LAMINATES

(71) Applicant: Bard Access Systems, Inc., Salt Lake City, UT (US)

(72) Inventors: Vivek Pandey, Ujjain (IN); Leandro Forciniti, Wharton, NJ (US)

(73) Assignee: Bard Access Systems, Inc., Salt Lake City, UT (US)

( * ) Notice: Subject to any disclaimer, the term of this patent is extended or adjusted under 35 U.S.C. 154(b) by 523 days.

(21) Appl. No.: 18/112,159

(22) Filed: Feb. 21, 2023

(65) Prior Publication Data

US 2023/0274933 A1    Aug. 31, 2023

Related U.S. Application Data

(60) Provisional application No. 63/314,219, filed on Feb. 25, 2022.

(51) Int. Cl.
*H01L 21/02* (2006.01)

(52) U.S. Cl.
CPC .. *H01L 21/02444* (2013.01); *H01L 21/02282* (2013.01); *H01L 21/02505* (2013.01); *H01L 21/02527* (2013.01)

(58) Field of Classification Search
CPC ......... H01L 21/02444; H01L 21/02282; H01L 21/02505; H01L 21/02527; A61L 29/103;
(Continued)

(56) References Cited

U.S. PATENT DOCUMENTS

| | | | |
|---|---|---|---|
| 6,238,339 B1 | 5/2001 | Fiddian-Greene et al. | |
| 8,425,417 B2 | 4/2013 | Leach et al. | |

(Continued)

FOREIGN PATENT DOCUMENTS

| | | |
|---|---|---|
| EP | 2489520 A2 | 8/2012 |
| EP | 3095403 A2 | 11/2016 |

(Continued)

OTHER PUBLICATIONS

Duby, S., B. J. Ramsey, and D. J. Harrison. "Printed thick-film thermocouple sensors." Electronic Letters, vol. 41, No. 6. (Mar. 2005).

(Continued)

*Primary Examiner* — Dale E Page
*Assistant Examiner* — Quovaunda Jefferson
(74) *Attorney, Agent, or Firm* — Rutan & Tucker LLP

(57)    ABSTRACT

Methods for transferring graphene to substrates include at least a method for transferring a graphene-metal bilayer to a substrate to form a laminate thereof. The method can include applying a first continuous polymer layer to a graphene layer of the graphene-metal bilayer; applying a first discontinuous polymer layer to the first continuous polymer layer; applying a second continuous polymer layer to a metal layer of the graphene-metal bilayer; applying a second discontinuous polymer layer to the second continuous polymer layer; etching the first continuous polymer layer with a first etchant through the first discontinuous polymer layer; laminating the substrate by pressing the face of the graphene layer into a surface of the substrate; etching the second continuous polymer layer with a second etchant through the second discontinuous polymer layer, thereby transferring the graphene-metal bilayer to the substrate to form the laminate.

22 Claims, 3 Drawing Sheets

(58) Field of Classification Search

CPC .............. A61L 29/106; A61L 2420/02; A61L 2420/08; A61M 2025/006; A61M 2025/0009; G01K 7/028; C01B 32/194; B32B 15/00; B32B 15/08; B32B 15/09; B32B 15/095; B32B 15/20; B32B 3/266; B32B 7/12; B32B 27/281; B32B 37/06; B32B 37/10; B32B 37/1284; B32B 38/00; B32B 2255/06; B32B 2255/26; B32B 2535/00

See application file for complete search history.

(56) References Cited

U.S. PATENT DOCUMENTS

| | | | |
|---|---|---|---|
| 9,096,050 | B2 | 8/2015 | Bedell et al. |
| 9,397,237 | B2* | 7/2016 | Ushinsky ............... G02B 5/208 |
| 9,840,024 | B2 | 12/2017 | Zaretski et al. |
| 10,192,736 | B2 | 1/2019 | Zurutuza Elorza et al. |
| 10,661,542 | B2 | 5/2020 | Kim |
| 10,737,476 | B2 | 8/2020 | Johnson et al. |
| 11,183,625 | B2 | 11/2021 | Grande et al. |
| 2002/0111560 | A1 | 8/2002 | Kokate et al. |
| 2005/0148832 | A1 | 7/2005 | Reghabi et al. |
| 2008/0119706 | A1 | 5/2008 | Brister et al. |
| 2009/0124964 | A1 | 5/2009 | Each et al. |
| 2010/0063478 | A1 | 3/2010 | Selkee |
| 2011/0015533 | A1 | 1/2011 | Cox et al. |
| 2013/0030262 | A1 | 1/2013 | Burnett et al. |
| 2013/0098540 | A1 | 4/2013 | Lee et al. |
| 2015/0297292 | A1 | 10/2015 | Sutermeister et al. |
| 2015/0371848 | A1 | 12/2015 | Zaretski et al. |
| 2017/0273628 | A1 | 9/2017 | Ofek et al. |
| 2018/0092688 | A1 | 4/2018 | Tegg |
| 2019/0320947 | A1 | 10/2019 | Chen et al. |
| 2020/0100859 | A1 | 4/2020 | Shen et al. |
| 2020/0390951 | A1 | 12/2020 | Blanchard et al. |
| 2021/0001042 | A1 | 1/2021 | Ooi et al. |
| 2021/0022803 | A1 | 1/2021 | Olson et al. |
| 2021/0136938 | A1* | 5/2021 | Wu ........................ B32B 9/045 |
| 2021/0177511 | A1 | 6/2021 | Govari et al. |
| 2022/0001138 | A1 | 1/2022 | Howell |
| 2022/0265175 | A1 | 8/2022 | Helwa et al. |
| 2024/0180491 | A1 | 6/2024 | Pandey et al. |

FOREIGN PATENT DOCUMENTS

| | | |
|---|---|---|
| EP | 3187473 A1 | 7/2017 |
| EP | 2949282 B1 | 11/2019 |
| WO | 2015020610 A1 | 2/2015 |
| WO | 2016071780 A1 | 5/2016 |
| WO | 2017040469 A1 | 3/2017 |
| WO | 2017053882 A1 | 3/2017 |
| WO | 2018133053 A1 | 7/2018 |
| WO | 2021102467 A1 | 5/2021 |
| WO | 2022055806 A1 | 3/2022 |
| WO | 2023163938 A1 | 8/2023 |
| WO | 2024119121 A1 | 6/2024 |

OTHER PUBLICATIONS

Harzheim, A., Könemann, F., Gotsmann, B., van der Zant, H., & Gehring, P. (2020). Single-Material Graphene Thermocouples. Advanced Functional Materials, 30(22), 2000574.

Thalluri, L. N., et al. "Perforated serpentine membrane with AlN as dielectric material shunt capacitive Rf Mems switch fabrication and characterization." Microsystem Technologies, 26(6), pp. 2029-2041, (2020).

PCT/US2023/013501 filed Feb. 21, 2023 International Search Report and Written Opinion dated Jun. 21, 2023.

PCT/US2023/082155 filed Dec. 1, 2023 International Search Report and Written Opinion dated Apr. 16, 2024.

U.S. Appl. No. 18/074,078, filed Dec. 2, 2022 Non-Final Office Action dated Sep. 10, 2025.

* cited by examiner

METHODS FOR TRANSFERRING GRAPHENE TO SUBSTRATES AND RELATED LITHOGRAPHIC STACKS AND LAMINATES

PRIORITY

This application claims the benefit of priority to U.S. Provisional Application No. 63,314,219, filed Feb. 25, 2022, which is incorporated by reference in its entirety into this application.

BACKGROUND

Graphene, an allotrope of carbon consisting of a single layer of carbon atoms arranged in a two-dimensional honeycomb lattice, has mechanical strength (e.g., tensile strength), chemical stability, transparency, carrier mobility, a tunable band gap, and electrical conductivity that makes it useful in a wide variety of applications. Indeed, many consider graphene to have an important upcoming role in the next generation of electronics, enabling the development of both smaller and lower-power devices.

Chemical vapor deposition ("CVD") has shown promise as a scalable and economical process for growing graphene on catalysts such as copper and nickel. However, the ability to successfully transfer such graphene onto various substrates has been difficult, often resulting in residual metal or metal-etching residues on the graphene or defects (e.g., wrinkles or holes) in the graphene itself. The ability to transfer graphene cleanly and successfully onto various substrates remains an important and active area of research in view of the wide variety of applications for graphene. Accordingly, new methods such as those for transferring graphene to various substrate are needed to realize the full potential of graphene.

Disclosed herein are methods for transferring graphene to various substrates along with lithographic stacks and laminates related thereto.

SUMMARY

Disclosed is a method of transferring a graphene-metal bilayer to a substrate. The method includes, in some embodiments, a first continuous polymer layer-applying step; a first discontinuous polymer layer-applying step; a second continuous polymer layer-applying step; a second discontinuous polymer layer-applying step; a first etching step; a laminating step; and a second etching step. The first continuous polymer layer-applying step includes applying a first continuous polymer layer to an exposed face of a graphene layer of the graphene-metal bilayer. The first discontinuous polymer layer-applying step includes applying a first discontinuous polymer layer to an exposed face of the first continuous polymer layer, thereby forming a first sacrificial layer of the first continuous polymer layer and the first discontinuous polymer layer. The second continuous polymer layer-applying step includes applying a second continuous polymer layer to an exposed face of a metal layer of the graphene-metal bilayer. The second discontinuous polymer layer-applying step includes applying a second discontinuous polymer layer to an exposed face of the second continuous polymer layer, thereby forming a second sacrificial layer of the second continuous polymer layer and the second discontinuous polymer layer. The first etching step includes selectively etching the first continuous polymer layer with a first etchant through the first discontinuous polymer layer, thereby removing the first sacrificial layer and reexposing the face of the graphene layer. The laminating step includes laminating the substrate by pressing the face of the graphene layer into a surface of the substrate. The second etching step includes selectively etching the second continuous polymer layer with a second etchant through the second discontinuous polymer layer, thereby removing the second sacrificial layer and reexposing the face of the metal layer. Upon completing the second etching step, the graphene-metal bilayer is transferred to the substrate.

In some embodiments, the graphene layer is monolayer graphene.

In some embodiments, the graphene layer is bilayer graphene.

In some embodiments, the graphene layer is multilayer graphene having three or more layers of graphene.

In some embodiments, the first continuous polymer layer-applying step includes spray coating or spin coating the first continuous polymer layer onto the exposed face of the graphene layer.

In some embodiments, the first continuous polymer layer is about 1-2 μm thick after the applying of the first continuous polymer layer to the exposed face of the graphene layer in the first continuous polymer layer-applying step.

In some embodiments, the first continuous polymer layer is poly(methyl methacrylate) ("PMMA").

In some embodiments, the first discontinuous polymer layer-applying step includes pressing the first discontinuous polymer layer into the exposed face of the first continuous polymer layer with heat.

In some embodiments, the first discontinuous polymer layer is perforated therethrough with an array of perforations. The perforations allow the first etchant to permeate through the first discontinuous polymer layer during the first etching step.

In some embodiments, the second continuous polymer layer-applying step includes spray coating or spin coating the second continuous polymer layer onto the exposed face of the metal layer.

In some embodiments, the second continuous polymer layer is about 1-2 μm thick after the applying of the second continuous polymer layer to the exposed face of the metal layer in the second continuous polymer layer-applying step.

In some embodiments, the second continuous polymer layer is poly(vinyl alcohol) ("PVA").

In some embodiments, the second discontinuous polymer layer-applying step includes pressing the second discontinuous polymer layer into the exposed face of the second continuous polymer layer with heat.

In some embodiments, the second discontinuous polymer layer is perforated therethrough with an array of perforations. The perforations allow the second etchant to permeate through the second discontinuous polymer layer during the second etching step.

In some embodiments, each discontinuous polymer layer of the first and second discontinuous polymer layers is independently polyimide ("PI"), poly(ethylene terephthalate) ("PET"), or poly(ethylene naphthalate) ("PEN").

In some embodiments, the first etchant is acetone.

In some embodiments, the method further includes an adhesive-applying step. The adhesive-applying step includes applying an adhesive to the surface of the substrate before the laminating step.

In some embodiments, the substrate is a catheter tube or Luer connector of a catheter.

In some embodiments, the substrate is thermoplastic polyurethane ("TPU").

In some embodiments, the second etchant is water.

Also disclosed is another method of transferring a graphene-metal bilayer to a substrate. The method includes, in some embodiments, a first continuous polymer layer-applying step; a first discontinuous polymer layer-applying step; a second continuous polymer layer-applying step; a second discontinuous polymer layer-applying step; a first etching step; a laminating step; and a second etching step. The first continuous polymer layer-applying step includes spray coating or spin coating a first continuous polymer layer of PMMA with a thickness of about 1-2 µm onto an exposed face of a graphene layer of monolayer graphene, bilayer graphene, or multilayer graphene of the graphene-metal bilayer. The first discontinuous polymer layer-applying step includes pressing a first discontinuous polymer layer of PI, PET, or PEN with a thickness of about 25-50 µm into an exposed face of the first continuous polymer layer with heat. The first discontinuous polymer layer is perforated therethrough with an array of perforations. The second continuous polymer layer-applying step includes spray coating or spin coating a second continuous polymer layer of PVA with a thickness of about 1-2 µm onto an exposed face of a metal layer of the graphene-metal bilayer. The second discontinuous polymer layer-applying step includes pressing a second discontinuous polymer layer of PI, PET, or PEN with a thickness of about 25-50 µm into an exposed face of the second continuous polymer layer with heat. The second discontinuous polymer layer is perforated therethrough with an array of perforations. The first etching step includes selectively etching the first continuous polymer layer with a first etchant of acetone through the perforations of the first discontinuous polymer layer to reexpose the face of the graphene layer. The laminating step includes laminating the substrate of TPU by pressing the face of the graphene layer into a surface of the substrate. The surface of the substrate optionally includes an adhesive applied thereon. The second etching step includes selectively etching the second continuous polymer layer with a second etchant of water through the perforations of the second discontinuous polymer layer to reexpose the face of the metal layer. Upon completing the second etching step, the graphene-metal bilayer is transferred to the substrate.

In some embodiments, the substrate is a catheter tube or Luer connector of a catheter.

Also disclosed is a method of transferring a graphene layer to a substrate. The method includes, in some embodiments, a first continuous polymer layer-applying step; a first discontinuous polymer layer-applying step; a second continuous polymer layer-applying step; a second discontinuous polymer layer-applying step; a first etching step; a laminating step; and a second etching step. The first continuous polymer layer-applying step includes applying a first continuous polymer layer to an exposed first face of the graphene layer. The first discontinuous polymer layer-applying step includes applying a first discontinuous polymer layer to an exposed face of the first continuous polymer layer, thereby forming a first sacrificial layer of the first continuous polymer layer and the first discontinuous polymer layer. The second continuous polymer layer-applying step includes applying a second continuous polymer layer to an exposed second face of the graphene layer. The second discontinuous polymer layer-applying step includes applying a second discontinuous polymer layer to an exposed face of the second continuous polymer layer, thereby forming a second sacrificial layer of the second continuous polymer layer and the second discontinuous polymer layer. The first etching step includes selectively etching the first continuous polymer layer with a first etchant through the first discontinuous polymer layer, thereby removing the first sacrificial layer and reexposing the first face of the graphene layer. The laminating step includes laminating the substrate by pressing the first face of the graphene layer into a surface of the substrate. The second etching step includes selectively etching the second continuous polymer layer with a second etchant through the second discontinuous polymer layer, thereby removing the second sacrificial layer and reexposing the second face of the graphene layer. Upon completing the second etching step, the graphene layer is transferred to the substrate.

Also disclosed is a laminate including, in some embodiments, a substrate including one or more layers of a polymer and a graphene-metal bilayer laminated over at least a portion of the substrate.

In some embodiments, the substrate has two dimensions.

In some embodiments, the substrate is a sheet including the one-or-more layers of the polymer.

In some embodiments, the substrate has three dimensions.

In some embodiments, the substrate is a medical device or a portion of the medical device including the one-or-more layers of the polymer.

In some embodiments, the substrate is a Luer connector of a catheter.

In some embodiments, the substrate is a catheter tube of a catheter.

In some embodiments, the graphene-metal bilayer is patterned into one or more electronic devices.

In some embodiments, the one-or-more electronic devices include at least a single-material graphene thermocouple as a temperature sensor.

In some embodiments, the polymer is TPU.

In some embodiments, the laminate further includes an adhesive layer between the substrate and the graphene-metal bilayer.

In some embodiments, the graphene-metal bilayer includes a metal layer over a graphene layer.

In some embodiments, the metal layer is formed of copper or nickel.

In some embodiments, the graphene layer is monolayer graphene.

In some embodiments, the graphene layer is bilayer graphene.

In some embodiments, the graphene layer is multilayer graphene having three or more layers of graphene.

Also disclosed is a lithographic stack for transferring a graphene-metal bilayer to a substrate. The lithographic stack includes, in some embodiments, a graphene-metal bilayer, a first sacrificial layer over the graphene-metal bilayer, and a second sacrificial layer under the graphene-metal bilayer. The first sacrificial layer includes a first continuous polymer layer over a graphene layer of the graphene-metal bilayer and a first discontinuous polymer layer over the first continuous polymer layer. The second sacrificial layer includes a second continuous polymer layer under a metal layer of the graphene-metal bilayer and a second discontinuous polymer layer under the second continuous polymer layer. The first continuous polymer layer and the second continuous polymer layer of two different materials have exclusive lability between at least two different etchants.

In some embodiments, the graphene layer is monolayer graphene.

In some embodiments, the graphene layer is bilayer graphene.

In some embodiments, the graphene layer is multilayer graphene having three or more layers of graphene.

In some embodiments, the first continuous polymer layer is about 1-2 μm thick.

In some embodiments, the first continuous polymer layer is PMMA.

In some embodiments, the first discontinuous polymer layer is perforated therethrough with an array of perforations. The array of perforations allows a first etchant of the at least two etchants to permeate through the first discontinuous polymer for selectively etching the first continuous polymer layer.

In some embodiments, the first etchant is acetone.

In some embodiments, the second continuous polymer layer is about 1-2 μm.

In some embodiments, the second continuous polymer layer is PVA.

In some embodiments, the second discontinuous polymer layer is perforated therethrough with an array of perforations. The array of perforations allows a second etchant of the at least two etchants to permeate through the second discontinuous polymer for selectively etching the second continuous polymer layer.

In some embodiments, the second etchant is water.

In some embodiments, each discontinuous polymer layer of the first and second discontinuous polymer layers is independently PI, PET, or PEN.

These and other features of the concepts provided herein will become more apparent to those of skill in the art in view of the accompanying drawings and following description, which describe particular embodiments of such concepts in greater detail.

DRAWINGS

DESCRIPTION

Figure 1:
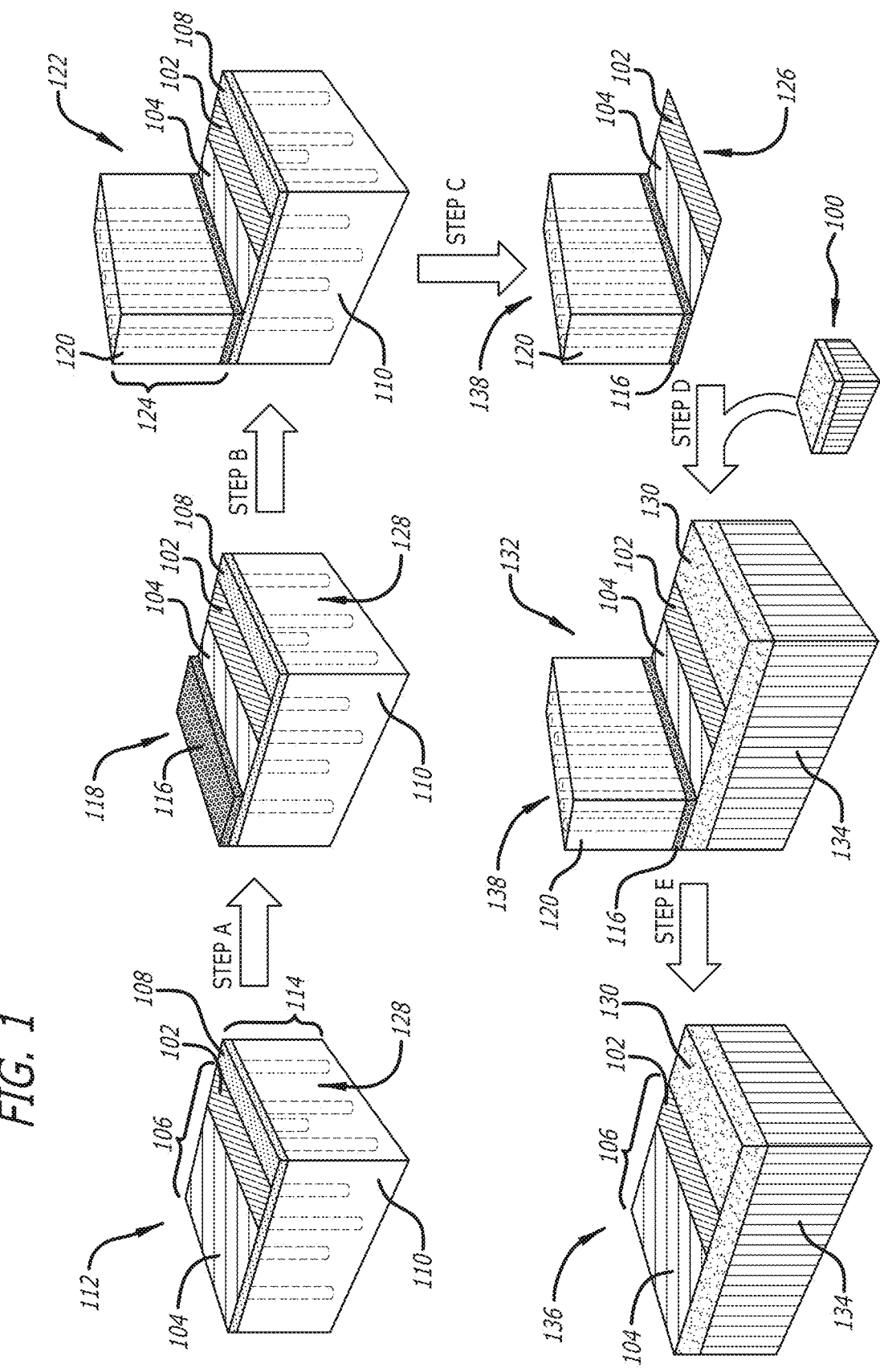
FIG. 1 illustrates a method of transferring graphene to a substrate in accordance with some embodiments.

Before some particular embodiments are disclosed in greater detail, it should be understood that the particular embodiments disclosed herein do not limit the scope of the concepts provided herein. It should also be understood that a particular embodiment disclosed herein can have features that can be readily separated from the particular embodiment and optionally combined with or substituted for features of any of a number of other embodiments disclosed herein.

Regarding terms used herein, it should also be understood the terms are for the purpose of describing some particular embodiments, and the terms do not limit the scope of the concepts provided herein. Ordinal numbers (e.g., first, second, third, etc.) are generally used to distinguish or identify different features or steps in a group of features or steps, and do not supply a serial or numerical limitation. For example, "first," "second," and "third" features or steps need not necessarily appear in that order, and the particular embodiments including such features or steps need not necessarily be limited to the three features or steps. In addition, any of the foregoing features or steps can, in turn, further include one or more features or steps unless indicated otherwise. Labels such as "left," "right," "top," "bottom," "front,"

"back," and the like are used for convenience and are not intended to imply, for example, any particular fixed location, orientation, or direction. Instead, such labels are used to reflect, for example, relative location, orientation, or directions. Singular forms of "a," "an," and "the" include plural references unless the context clearly dictates otherwise.

With respect to "proximal," a "proximal portion" or "proximal section" of, for example, a catheter includes a portion or section of the catheter intended to be near a clinician when the catheter is used on a patient. Likewise, a "proximal length" of, for example, the catheter includes a length of the catheter intended to be near the clinician when the catheter is used on the patient. A "proximal end" of, for example, the catheter includes an end of the catheter intended to be near the clinician when the catheter is used on the patient. The proximal portion, the proximal section, or the proximal length of the catheter can include the proximal end of the catheter; however, the proximal portion, the proximal section, or the proximal length of the catheter need not include the proximal end of the catheter. That is, unless context suggests otherwise, the proximal portion, the proximal section, or the proximal length of the catheter is not a terminal portion or terminal length of the catheter.

With respect to "distal," a "distal portion" or a "distal section" of, for example, a catheter includes a portion or section of the catheter intended to be near or in a patient when the catheter is used on the patient. Likewise, a "distal length" of, for example, the catheter includes a length of the catheter intended to be near or in the patient when the catheter is used on the patient. A "distal end" of, for example, the catheter includes an end of the catheter intended to be near or in the patient when the catheter is used on the patient. The distal portion, the distal section, or the distal length of the catheter can include the distal end of the catheter; however, the distal portion, the distal section, or the distal length of the catheter need not include the distal end of the catheter. That is, unless context suggests otherwise, the distal portion, the distal section, or the distal length of the catheter is not a terminal portion or terminal length of the catheter.

Unless defined otherwise, all technical and scientific terms used herein have the same meaning as commonly understood by those of ordinary skill in the art.

As set forth above, CVD has shown promise as a scalable and economical process for growing graphene on catalysts such as copper and nickel. However, the ability to successfully transfer such graphene onto various substrates has been difficult, often resulting in residual metal or metal-etching residues on the graphene or defects (e.g., wrinkles or holes) in the graphene itself. The ability to transfer graphene cleanly and successfully onto various substrates remains an important and active area of research in view of the wide variety of applications for graphene. Accordingly, new methods such as those for transferring graphene to various substrate are needed to realize the full potential of graphene.

Disclosed are methods for transferring graphene to substrates along with lithographic stacks and laminates related thereto. For example, a method includes transferring a graphene-metal bilayer to a substrate to form a laminate thereof. The method can include applying a first continuous polymer layer to a graphene layer of the graphene-metal bilayer; applying a first discontinuous polymer layer to the first continuous polymer layer; applying a second continuous polymer layer to a metal layer of the graphene-metal bilayer; applying a second discontinuous polymer layer to the second continuous polymer layer; etching the first continuous polymer layer with a first etchant through the first discontinuous polymer layer; laminating the substrate by pressing the face of the graphene layer into a surface of the substrate; etching the second continuous polymer layer with a second etchant through the second discontinuous polymer layer, thereby transferring the graphene-metal bilayer to the substrate to form the laminate.

FIG. 1 illustrates a method of transferring graphene to a substrate 100 in accordance with some embodiments. Notably, the method can include one or more steps selected from those shown in FIG. 1 or described below. In addition, while many possible steps of the method of transferring graphene to the substrate 100 are named herein, it should be understood that the method can include steps described herein but not named. Lastly, any of the many possible steps of the method of transferring graphene to the substrate 100 named or described herein can, in turn, further include one or more steps (e.g., substeps) unless indicated otherwise.

While not shown, the method can commence with a graphene-growing step. The graphene-growing step includes growing a graphene layer 102 on a metal layer 104 by CVD or the like to form a graphene-metal bilayer 106. However, the metal layer 104 upon which the graphene layer 102 is grown can be the same or different than the metal layer 104 set forth below depending upon whether one or more additional steps are performed to, in effect, exchange metal layers. For example, the graphene layer 102 can be grown on a nickel or copper layer as the metal layer 104 in the graphene-growing step, and the nickel or copper layer can be, in effect, exchanged with a palladium or gold layer, which becomes the metal layer 104 set forth below. That said, the metal layer 104 upon which the graphene layer 102 is grown can be alternatively removed in its entirety in one or more additional steps, thereby substituting the graphene-metal bilayer 106 set forth below with the graphene layer 102 alone. Regardless, when present, the metal layer 104 can be formed of gold, silver, palladium, copper, or nickel; however, copper is generally preferred for the one-or-more electronic devices described below. The graphene layer 102 grown on the metal layer 104 can be monolayer graphene, bilayer graphene, or multilayer graphene including three or more layers of graphene.

While not shown, the method can include a first continuous polymer layer-applying step. The first continuous polymer layer-applying step includes applying a first continuous polymer layer 108 (e.g., poly[methyl methacrylate] ["PMMA"]) to an exposed face of the graphene layer 102 of the graphene-metal bilayer 106, for example, by spray coating or spin coating the first continuous polymer layer 108 onto the exposed face of the graphene layer 102 until it is about 1-2 μm thick, to form a lithographic stack of the graphene-metal bilayer 106 and the first continuous polymer layer 108. Notably, the first continuous polymer layer-applying step can be discerned from the second continuous polymer layer-applying step (Step A) shown in FIG. 1, albeit starting from an opposite side of the graphene-metal bilayer 106.

While not shown, the method can include a first discontinuous polymer layer-applying step, optionally, following a first perforating step to form a first discontinuous polymer layer 110. The first discontinuous polymer layer-applying step includes applying the first discontinuous polymer layer 110 (e.g., about 25-50 μm of polyimide ["PI"], poly[ethylene terephthalate] ["PET"], or poly[ethylene naphthalate] ["PEN"], but independent of the second discontinuous polymer layer 120) to an exposed face of the first continuous polymer layer 108, for example, by pressing the first discontinuous polymer layer 110 into the exposed face of the first continuous polymer layer 108 with heat, to form a lithographic stack 112 of the graphene-metal bilayer 106 and a first sacrificial layer 114, wherein the first sacrificial layer 114 includes the first continuous polymer layer 108 and the first discontinuous polymer layer 110. Pressure and temperature applied during the first discontinuous polymer layer-applying step should be that sufficient for bonding the graphene-metal bilayer 106 and the first sacrificial layer 114 with enough integrity for holding the lithographic stack 112 together for subsequent roll-to-roll or batch processing. Notably, the first discontinuous polymer layer-applying step can be discerned from the second discontinuous polymer layer-applying step (Step B) shown in FIG. 1, albeit starting from the opposite side of the graphene-metal bilayer 106 with the first continuous polymer layer 108 thereon.

As shown, the method can include a second continuous polymer layer-applying step (Step A). The second continuous polymer layer-applying step includes applying a second continuous polymer layer 116 (e.g., poly[vinyl alcohol] ["PVA"]) to an exposed face of the metal layer 104 of the graphene-metal bilayer 106, for example, by spray coating or spin coating the second continuous polymer layer 116 onto the exposed face of the graphene layer 102 until it is about 1-2 μm thick, to form a lithographic stack 118 of the graphene-metal bilayer 106, the first sacrificial layer 114, and the second continuous polymer layer 116. Notably, the first continuous polymer layer 108 and the second continuous polymer 116 layer are of two different materials such as PMMA and PVA, respectively, having exclusive lability between at least two different etchants such as the acetone and water described below.

As shown, the method can include a second discontinuous polymer layer-applying step (Step B), optionally, following a second perforating step to form a second discontinuous polymer layer 120. The second discontinuous polymer layer-applying step (Step B) includes applying the second discontinuous polymer layer 120 (e.g., about 25-50 μm of PI, PET, or PEN, but independent of the first discontinuous polymer layer 110) to an exposed face of the second continuous polymer layer 116, for example, by pressing the second discontinuous polymer layer 120 into the exposed face of the second continuous polymer layer 116 with heat, to form a lithographic stack 122 of the graphene-metal bilayer 106, the first sacrificial layer 114, and a second sacrificial layer 124, wherein the second sacrificial layer 124 includes the second continuous polymer layer 116 and the second discontinuous polymer layer 120. Indeed, the lithographic stack 122 includes the graphene-metal bilayer 106, the first sacrificial layer 114 over the graphene-metal bilayer 106, and the second sacrificial layer 124 under the graphene-metal bilayer 106. Pressure and temperature applied during the second discontinuous polymer layer-applying step should be that sufficient for bonding the graphene-metal bilayer 106 and the second sacrificial layer 124 with enough integrity for holding the lithographic stack 122 together for subsequent roll-to-roll or batch processing.

As shown, the method can include a first etching step (Step C). The first etching step (Step C) includes selectively etching the first continuous polymer layer 108 with a first etchant (e.g., acetone at about 40-50° C.) through the first discontinuous polymer layer 110, thereby removing the first sacrificial layer 114 and reexposing the face of the graphene layer 102 to form a lithographic stack 126 of the graphene-metal bilayer 106 and the second sacrificial layer 124. Notably, the first discontinuous polymer layer 110 is permeable to the first etchant. Indeed, the first discontinuous polymer layer 110 is perforated therethrough with a regular or irregular array of perforations 128 up to at least 10%, 15%, 20%, 25%, 30%, 35%, 40%, 45%, of 50% of the first discontinuous polymer layer 110. For example, up to at least 33% of the first discontinuous polymer layer 110 can be perforated out of the first discontinuous polymer layer 110. The array of perforations 128 allows the first etchant to permeate through the first discontinuous polymer layer 110 during the first etching step to selectively etch the first continuous polymer layer 108 over the second continuous polymer layer 116 or any other layers present.

While not shown, the method can include an adhesive-applying step. The adhesive-applying step includes applying an adhesive 130 to a surface of the substrate 100 before the laminating step described below. Notably, the laminate 132 described below might or might not benefit from the adhesive 130 depending upon a surface chemistry between the face of the graphene layer 102 and the surface of the substrate 100.

As shown, the method can include a laminating step (Step D). The laminating step (Step D) includes laminating at least a portion of the substrate 100 by pressing the face of the graphene layer 102 into the surface of the substrate 100 or the portion thereof, optionally, with the adhesive 130, to form a laminate 132 of the substrate 100 and the graphene-metal bilayer 106 with a remainder of the lithographic stack 126, namely, the second sacrificial layer 124, thereon. Notably, the substrate 100 can have two dimensions for a two-dimensional substrate such as a sheet including one or more polymer layers 134 of a polymer, for example, thermoplastic polyurethane ("TPU"). Alternatively, the substrate 100 can have three dimensions for a three-dimensional substrate such as a medical device (e.g., a catheter, a stylet, a cannula, a syringe, etc.) including the one-or-more polymer layers 134 of the foregoing polymer. The three-dimensional substrate or the portion thereof laminated with the graphene-metal bilayer 106 can be non-planar such as curved. Indeed, the portion of the three-dimensional substrate laminated with the graphene-metal bilayer 106 can be curved like the catheter tube 140 of the catheter 139 described below.

As shown, the method can include a second etching step (Step E). The second etching step (Step E) includes selectively etching the second continuous polymer layer 116 with a second etchant (e.g., water or deionized water at about 60-80° C.) through the second discontinuous polymer layer 120, thereby removing the second sacrificial layer 124 and reexposing the face of the metal layer 104 to form a laminate 136 of the substrate 100 and the graphene-metal bilayer 106. Notably, the second discontinuous polymer layer 120 is permeable to the second etchant. Indeed, the second discontinuous polymer layer 120 is perforated therethrough with a regular or irregular array of perforations 138 up to at least 10%, 15%, 20%, 25%, 30%, 35%, 40%, 45%, of 50% of the second discontinuous polymer layer 120. For example, up to at least 33% of the second discontinuous polymer layer 120 can be perforated out of the second discontinuous polymer layer 120. The array of perforations 138 allows the second etchant to permeate through the second discontinuous polymer layer 120 during the second etching step to selectively etch the second continuous polymer layer 116 over any other layers present.

Notably, the foregoing method of transferring graphene to the substrate 100 is advantageously capable of large-scale production such as in roll-to-roll or batch processing.

Upon completing the second etching step of the method of transferring graphene to the substrate 100 described above, the graphene-metal bilayer 106 is successfully transferred to at least a portion of the substrate 100, thereby forming the laminate 136. As described above, the substrate 100 can be a two-dimensional substrate (e.g., a sheet). The laminate resulting from such a two-dimensional substrate includes the graphene-metal bilayer 106 laminated over at least a portion of the substrate 100 for a two-dimensional laminate. As described above, the substrate 100 can alternatively be a three-dimensional substrate (e.g., a medical device). The laminate resulting from such a three-dimensional substrate includes the graphene-metal bilayer 106 laminated over at least a portion of the substrate 100 for a three-dimensional laminate.

Figure 2:
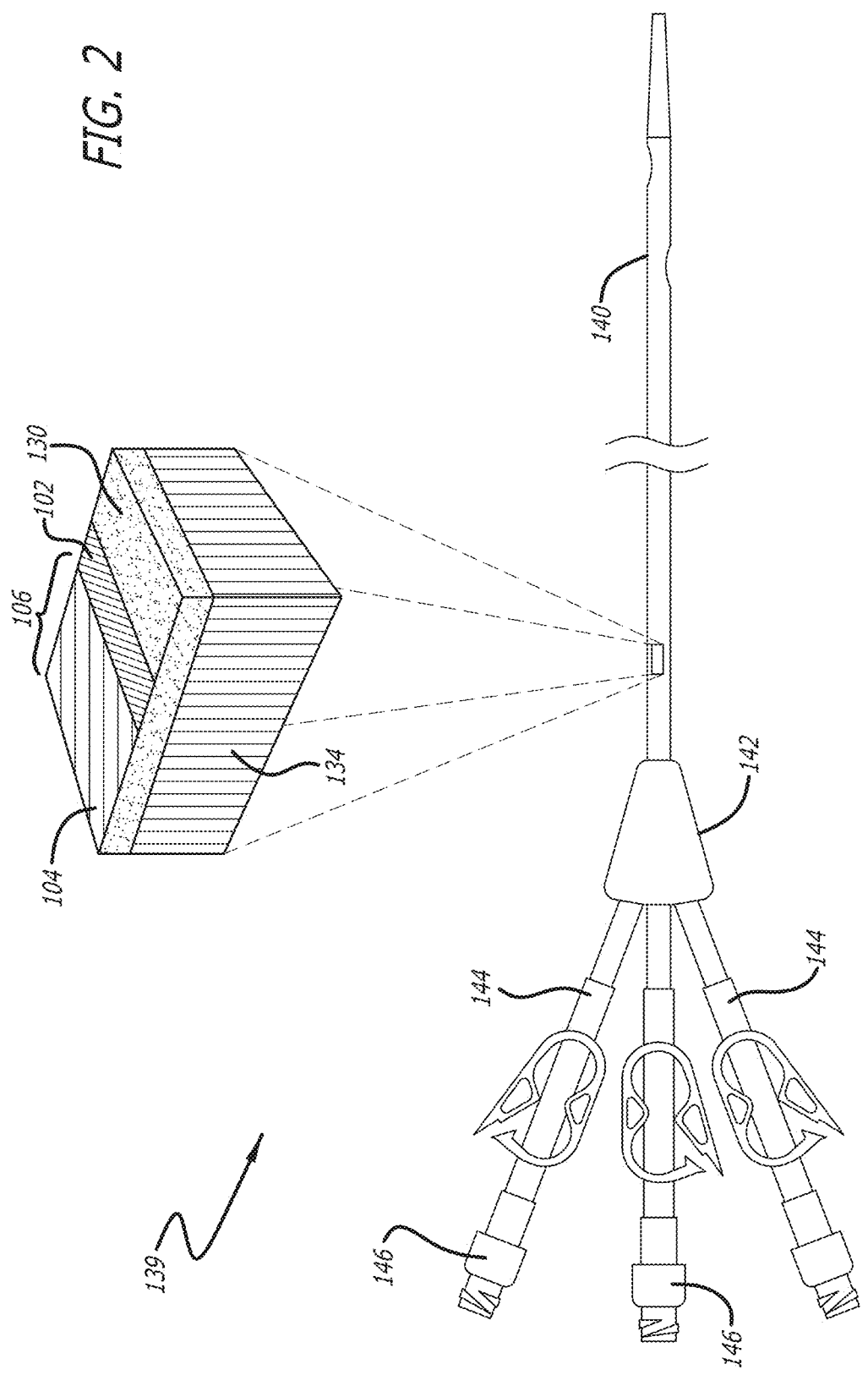
FIG. 2 illustrates a laminate as a portion of a catheter having a catheter tube laminated with a graphene-metal bilayer in accordance with some embodiments.
Figure 3:
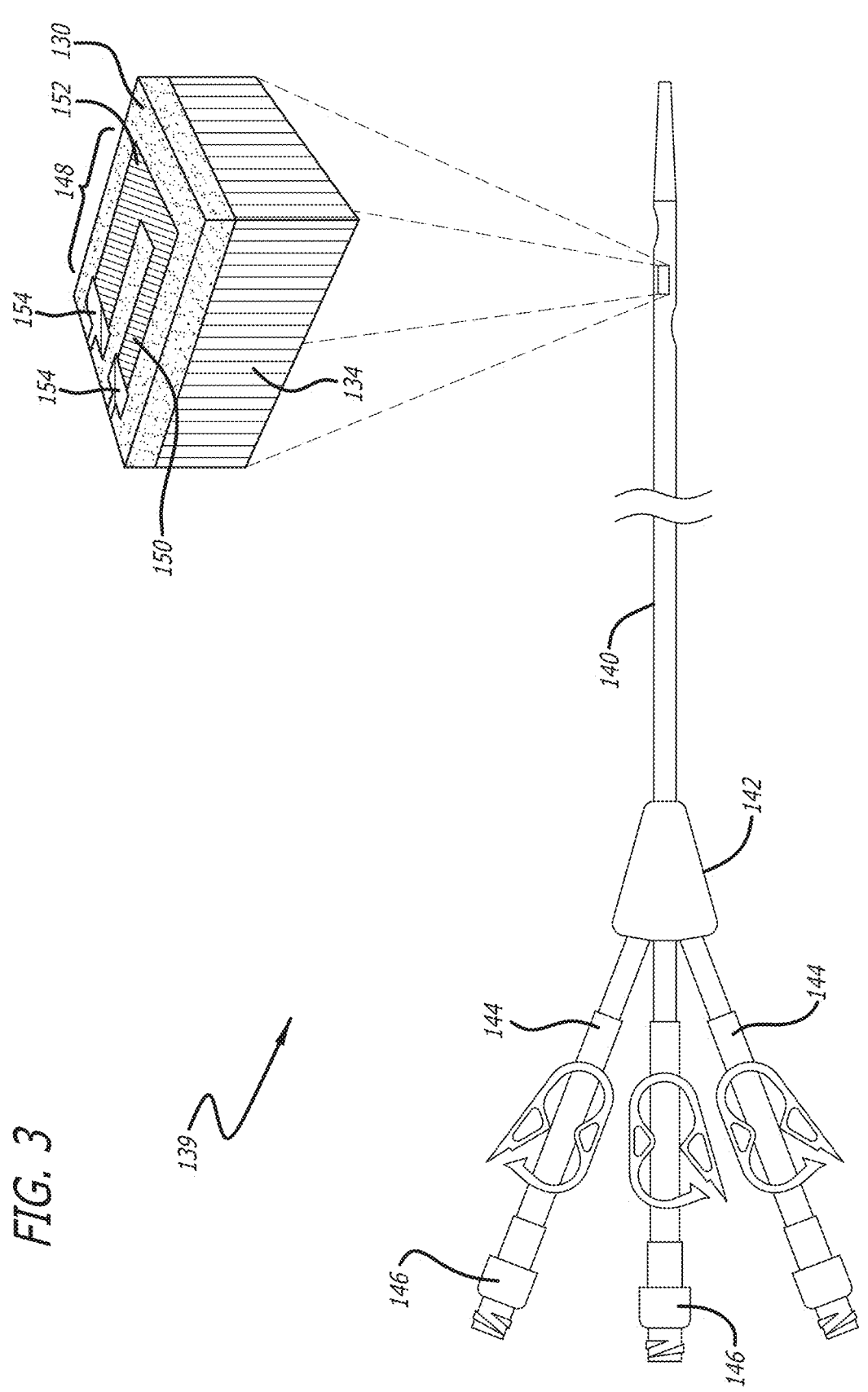
FIG. 3 illustrates another laminate as a portion of a catheter having a catheter tube with a graphene-metal bilayer patterned into an electronic device in accordance with some embodiments.

FIGS. 2 and 3 illustrate the laminate 136 as a portion of a catheter 139 having a catheter tube 140 laminated with the graphene-metal bilayer 106 in accordance with some embodiments.

As shown, the laminate 136 includes a portion of the catheter 139 thereof laminated with the graphene-metal bilayer 106. While the portion of the catheter 139 laminated with the graphene-metal bilayer 106 shown in FIG. 2 is at least a proximal portion of the catheter tube 140 (up to an entirety of the catheter tube 140), the portion of the catheter 139 laminated with the graphene-metal bilayer 106 can additionally or alternatively be a hub 142, one or more extension legs 144, or one of more Luer connectors 146. As shown in FIG. 3, the catheter tube 140 can be advantageously laminated in at least a distal portion thereof to include one or more electronic devices. Indeed, the graphene-metal bilayer 106 can be patterned either before or after the laminating step in one or more pattering steps, which, in turn, can include various masking and etching steps, to yield the one-or-more electronic devices. The one-or-more electronic devices can include at least a single-material graphene thermocouple 148 as a temperature sensor. Such a thermocouple can be like that described in Harzheim, A., Könemann, F., Gotsmann, B., van der Zant, H., & Gehring, P. (2020). Single-Material Graphene Thermocouples. *Advanced Functional Materials*, 30(22), 2000574, the thermocouple 148 including, for example, the graphene layer 102 patterned into a narrower leg 150 and a wider leg 152 having different Seeback coefficients coupled together in a thermocouple junction therebetween and the metal layer 104 patterned into electrical contacts 154 and leads extending therefrom.

While some particular embodiments have been disclosed herein, and while the particular embodiments have been disclosed in some detail, it is not the intention for the particular embodiments to limit the scope of the concepts provided herein. Additional adaptations or modifications can appear to those of ordinary skill in the art, and, in broader aspects, these adaptations or modifications are encompassed as well. Accordingly, departures may be made from the particular embodiments disclosed herein without departing from the scope of the concepts provided herein.

What is claimed is:

1. A method of transferring a graphene-metal bilayer to a substrate, comprising:

applying a first continuous polymer layer to an exposed face of a graphene layer of the graphene-metal bilayer;

applying a first discontinuous polymer layer to an exposed face of the first continuous polymer layer, thereby forming a first sacrificial layer of the first continuous polymer layer and the first discontinuous polymer layer;

applying a second continuous polymer layer to an exposed face of a metal layer of the graphene-metal bilayer;

applying a second discontinuous polymer layer to an exposed face of the second continuous polymer layer, thereby forming a second sacrificial layer of the second continuous polymer layer and the second discontinuous polymer layer;

selectively etching the first continuous polymer layer with a first etchant through the first discontinuous polymer layer, thereby removing the first sacrificial layer and reexposing the face of the graphene layer;

laminating the substrate by pressing the face of the graphene layer into a surface of the substrate; and selectively etching the second continuous polymer layer with a second etchant through the second discontinuous polymer layer, thereby removing the second sacrificial layer, reexposing the face of the metal layer, and transferring the graphene-metal bilayer to the substrate.

2. The method of claim 1, wherein the graphene layer is monolayer graphene.

3. The method of claim 1, wherein the graphene layer is bilayer graphene.

4. The method of claim 1, wherein the graphene layer is multilayer graphene having three or more layers of graphene.

5. The method of claim 1, wherein applying the first continuous polymer layer to the exposed face of the graphene layer includes spray coating or spin coating the first continuous polymer layer onto the exposed face of the graphene layer.

6. The method of claim 1, wherein the first continuous polymer layer is about 1-2 μm thick after applying the first continuous polymer layer to the exposed face of the graphene layer.

7. The method of claim 1, wherein the first continuous polymer layer is poly(methyl methacrylate) ("PMMA").

8. The method of claim 1, wherein applying the first discontinuous polymer layer to the exposed face of the first continuous polymer layer includes pressing the first discontinuous polymer layer into the exposed face of the first continuous polymer layer with heat.

9. The method of claim 1, wherein the first discontinuous polymer layer is perforated therethrough with an array of perforations, thereby allowing the first etchant to permeate through the first discontinuous polymer layer during selective etching of the first continuous polymer layer.

10. The method of claim 1, wherein applying the second continuous polymer layer to the exposed face of the metal layer includes spray coating or spin coating the second continuous polymer layer onto the exposed face of the metal layer.

11. The method of claim 1, wherein the second continuous polymer layer is about 1-2 μm thick after applying the second continuous polymer layer to the exposed face of the metal layer.

12. The method of claim 1, wherein the second continuous polymer layer is poly(vinyl alcohol) ("PVA").

13. The method of claim 1, wherein applying the second discontinuous polymer layer to the exposed face of the second continuous polymer layer includes pressing the second discontinuous polymer layer into the exposed face of the second continuous polymer layer with heat.

14. The method of claim 1, wherein the second discontinuous polymer layer is perforated therethrough with an array of perforations, thereby allowing the second etchant to permeate through the second discontinuous polymer layer during selective etching of the second continuous polymer layer.

15. The method of claim 1, wherein each discontinuous polymer layer of the first discontinuous polymer layer and the second discontinuous polymer layer is independently polyimide ("PI"), poly(ethylene terephthalate) ("PET"), or poly(ethylene naphthalate) ("PEN").

16. The method of claim 1, wherein the first etchant is acetone.

17. The method of claim 1, further comprising applying an adhesive to the surface of the substrate before laminating the substrate.

18. The method of claim 1, wherein the substrate is a catheter tube or Luer connector of a catheter.

19. The method of claim 1, wherein the substrate is thermoplastic polyurethane ("TPU").

20. The method of claim 1, wherein the second etchant is water.

21. A method of transferring a graphene-metal bilayer to a substrate, comprising:

spray coating or spin coating a first continuous polymer layer of poly(methyl methacrylate) ("PMMA") with a thickness of about 1-2 μm onto an exposed face of a graphene layer of monolayer graphene, bilayer graphene, or multilayer graphene of the graphene-metal bilayer;

pressing a first discontinuous polymer layer of polyimide ("PI"), poly(ethylene terephthalate) ("PET"), or poly (ethylene naphthalate) ("PEN") with a thickness of about 25-50 μm into an exposed face of the first continuous polymer layer with heat, the first discontinuous polymer layer perforated therethrough with the array of perforations;

spray coating or spin coating a second continuous polymer layer of poly(vinyl alcohol) ("PVA") with a thickness of about 1-2 μm onto an exposed face of a metal layer of the graphene-metal bilayer;

pressing a second discontinuous polymer layer of PI, PET, or PEN with a thickness of about 25-50 μm into an exposed face of the second continuous polymer layer with heat, the second discontinuous polymer layer perforated therethrough with the array of perforations;

selectively etching the first continuous polymer layer with a first etchant of acetone through the perforations of the first discontinuous polymer layer to reexpose the face of the graphene layer;

laminating the substrate of thermoplastic polyurethane ("TPU") by pressing the face of the graphene layer into a surface of the substrate, the surface of the substrate optionally including an adhesive applied thereon; and selectively etching the second continuous polymer layer with a second etchant of water through the perforations of the second discontinuous polymer layer to reexpose the face of the metal layer, thereby transferring the graphene-metal bilayer to the substrate.

22. The method of claim 21, wherein the substrate is a catheter tube or Luer connector of a catheter.

* * * * *